United States Patent [19]
Kellogg et al.

[11] Patent Number: 6,070,262
[45] Date of Patent: *May 30, 2000

[54] RECONFIGURABLE I/O DRAM

[75] Inventors: Mark W. Kellogg, Essex Junction; Timothy J. Dell, Colchester; Erik L. Hedberg, Essex Junction; Claude L. Bertin, South Burlington, all of Vt.

[73] Assignee: International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).
This patent is subject to a terminal disclaimer.

[21] Appl. No.: 08/833,367

[22] Filed: Apr. 4, 1997

[51] Int. Cl.[7] .................................................. G11C 29/00
[52] U.S. Cl. ............................................................. 714/763
[58] Field of Search ..................................... 714/763, 767, 714/768, 769, 800; 365/52, 200

[56] References Cited

U.S. PATENT DOCUMENTS

| | | | |
|---|---|---|---|
| 4,527,251 | 7/1985 | Nibby, Jr. et al. . | |
| 4,612,640 | 9/1986 | Mehrotra et al. . | |
| 4,651,321 | 3/1987 | Woffinden et al. | 371/38 |
| 4,706,249 | 11/1987 | Nakagawa et al. | 371/38 |
| 5,014,187 | 5/1991 | Debize et al. . | |
| 5,109,521 | 4/1992 | Culley . | |
| 5,228,046 | 7/1993 | Blake et al. | 371/38.1 |
| 5,261,064 | 11/1993 | Wyland . | |
| 5,278,964 | 1/1994 | Mathews et al. . | |
| 5,289,477 | 2/1994 | Lenta et al. | 371/37.7 |
| 5,293,593 | 3/1994 | Hodge et al. . | |
| 5,313,624 | 5/1994 | Harriman et al. | 395/575 |
| 5,386,540 | 1/1995 | Young et al. . | |
| 5,404,336 | 4/1995 | Imai | 365/230.03 |
| 5,537,573 | 7/1996 | Ware et al. . | |
| 5,553,023 | 9/1996 | Lau et al. | 365/189.01 |

OTHER PUBLICATIONS

Patterson and Hennessy, Computer Organization & Design: The Hardware/Software Interface, pp. 475–476, 1994.

*Primary Examiner*—Albert De Cady
*Assistant Examiner*—Samuel Lin
*Attorney, Agent, or Firm*—Whitham, Curtis & Whitham; Robert A. Walsh, Esq.

[57] ABSTRACT

A Dynamic Random Access Memory (DRAM) configurable by eight (×8) or by nine (×9). The DRAM has nine Data Input/Outputs (I/Os). The memory array is divided into two or more sub-arrays, with sub-array cells arranged in addressable rows and columns. When the DRAM is configured ×8, one I/O is held in its high impedance state; one ninth of the DRAM's data path (between the array and the ninth I/O) is ignored; and, the entire array address space is available for data storage through eight I/Os. When the DRAM is configured ×9, all nine I/Os are active; the DRAM I/O path is reconfigured with part of the array providing the ninth bit through the ninth I/O; and the array address space reduced by one-eighth. All nine bits may be from a common sub-array. Alternatively, sub-arrays may be paired so that when the DRAM is configured ×9, eight bits are accessed in seven-eighths of one sub-array, with the ninth bit being accessed in one eighth of the other sub-array of the pair.

16 Claims, 4 Drawing Sheets

RECONFIGURABLE I/O DRAM

CROSS-REFERENCE TO RELATED APPLICATION

The Present invention is related to application Ser. No. 08/833,371 entitled "Programmable Burst Length DRAM" to Kellogg et al., assigned to the assignee of the present invention and filed coincident herewith.

FIELD OF THE INVENTION

The present invention generally relates to high bandwidth/performance Dynamic Random Access Memories (DRAMs) and, in particular, to high bandwidth/performance DRAMs.

BACKGROUND DESCRIPTION

Memory performance is a well known limitation to computer system performance. Ideally, the memory performance would match or exceed processor performance, i.e., a memory cycle time would be less than one processor clock cycle. This is almost never the case and, so, the memory is a system bottleneck. A state of the art high speed microprocessor may be based on a 200 MegaHertz (MHZ) clock with a 5 nanosecond (ns) clock period. A high performance DRAM may have a 60 ns access time, which falls far short of processor performance.

This system bottleneck is exacerbated by the rise in popularity of multimedia applications. Multimedia applications demand several times more bandwidth for main memory or frame-buffer memory than computational intensive tasks; tasks such as spread sheet analysis programs or, other Input/output (I/O) intensive applications such as word processing or printing.

Extended Data Out (EDO) and Synchronous DRAMs (SDRAMs) were developed to improve bandwidth. However, SDRAMs and EDO RAMs still do not match processor performance and, therefore, still limit system performance. Consequently, as faster microprocessors are developed for multimedia processing and high performance systems, faster memory architecture is being developed to bridge the memory/processor performance gap, e.g., wide I/O DRAMs.

While the problem of matching memory speed to processor performance is being addressed, memory reliability in such a high performance system has not. Traditional Error Checking Code (ECC) schemes are not easily adapted to such a high bandwidth/performance memory chip organization. Typical ECC schemes include parity checking and Single Error Correction—Double Error Detection (SEC/DED) codes.

Parity is preferred for narrow data words, i.e., eight or sixteen bits because it requires only one extra bit per byte. However, parity only indicates that one or more of the bits in the byte/word is in error.

SEC/DED codes are more reliable than parity, but for short data words (one or two bytes) require several check bits per word, and are, therefore, seldom used in such applications. SEC/DED is more efficient for a wider data word, i.e., 64 bits or greater, because for a wide data word (several bytes) the check bit/byte ratio may be reduced to less than one.

However, adding ECC to a memory system requires adding logic and extra memory chips for the six or more check bits. This extra memory may be in the form of extra memory chips or, special memory chips with nine or eighteen data input/outputs (I/Os).

Thus, there is a need for high bandwidth DRAM chips that lend themselves to ECC applications for high performance memory architectures.

OBJECTS OF THE INVENTION

It is therefore an object of the present invention to improve high performance memory system reliability.

It is another object of the present invention to eliminate the need for extra parity memory chips or x9 I/O memory chips for high performance memory systems with error checking capability.

SUMMARY OF THE INVENTION

The present invention is a Dynamic Random Access Memory (DRAM) configurable x8 or x9. The DRAM array is divided into two or more sub-arrays, with sub-array cells arranged in addressable rows and columns. The DRAM has nine data Input/Outputs (I/O). When the DRAM is configured in Normal mode (x8), eight I/O are active, the ninth being held in its high impedance state, and the entire address space is available for data storage. When the DRAM is configured in ECC mode (x9), all nine data I/O are active and the chip is reconfigured with part of the array remapped as storage for the ninth bit. In ECC mode, the DRAM's address space is reduced by one-eighth.

In one embodiment, part of each sub-array provides check bit storage for data stored in that sub-array. Preferably, data and check bits are located in the same page in this embodiment. So, seven-eighths of the page is data storage with associated check or parity bits stored in the remaining one eighth of the page.

In a second, embodiment the sub-arrays are paired in ECC mode, eight bits being accessed in one sub-array of the pair and the ninth bit being accessed in the other sub-array. In ECC mode, one eighth of each array is allocated for check bit storage.

BRIEF DESCRIPTION OF THE DRAWINGS

The foregoing and other objects, aspects and advantages will be better understood from the following detailed description of preferred embodiments of the invention with reference to the drawings, in which.

DESCRIPTION OF PREFERRED EMBODIMENTS

Figure 1:
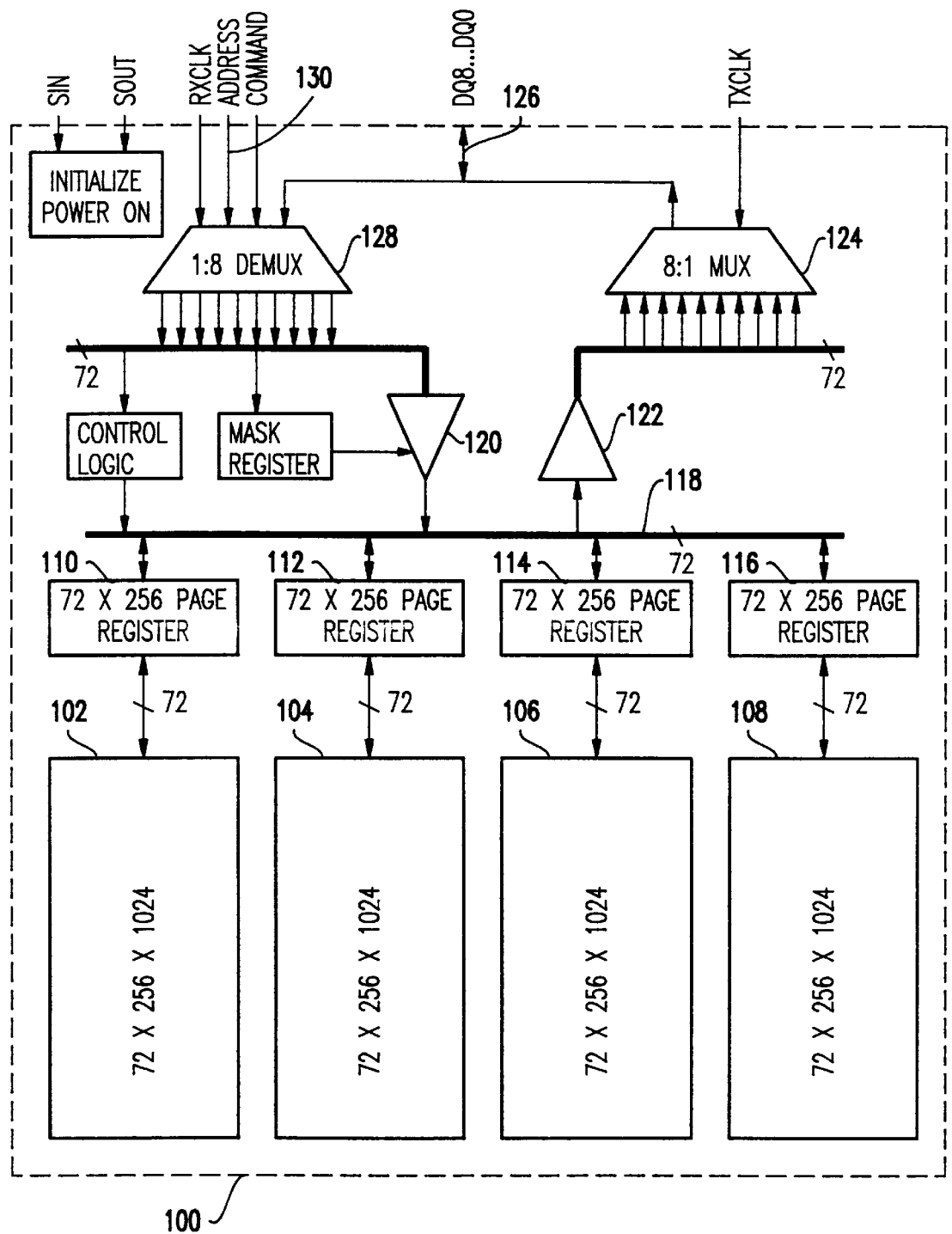
FIG. 1 is a block diagram of a typical seventy-two Megabit (Mb) high bandwidth memory chip 100 adapted for by 8 or by 9 operation.

FIG. 1 is a block diagram of a typical 72 Mb high bandwidth memory chip 100 adapted for by nine (x9) operation. The memory array of this 72 Mb chip includes four 18 Mb sub-arrays 102, 104, 106 and 108. Each sub-array 102, 104, 106 and 108 is buffered by a page register 110, 112, 114, or 116, respectively. Data to/from the page registers 110, 112, 114 and 116 is transferred on a Seventy-Two Bit Bus 118 from drivers 120 or to buffers 122. Buffers 122 pass data from the Seventy-Two Bit Bus 118 to an 8:1 multiplexer (mux) 124. One byte (9 bits) is selected by mux 124 and passed off chip 100 on I/Os 126. Data In from I/Os 126 is received by demultiplexer (demux) 128. Demux 128 places any received data at the appropriate nine inputs to drivers 120 in response to a previously received address. Address input enable 130 places all I/O drivers in their high impedance state so that an address may be received on the I/O's 126.

Figure 2:
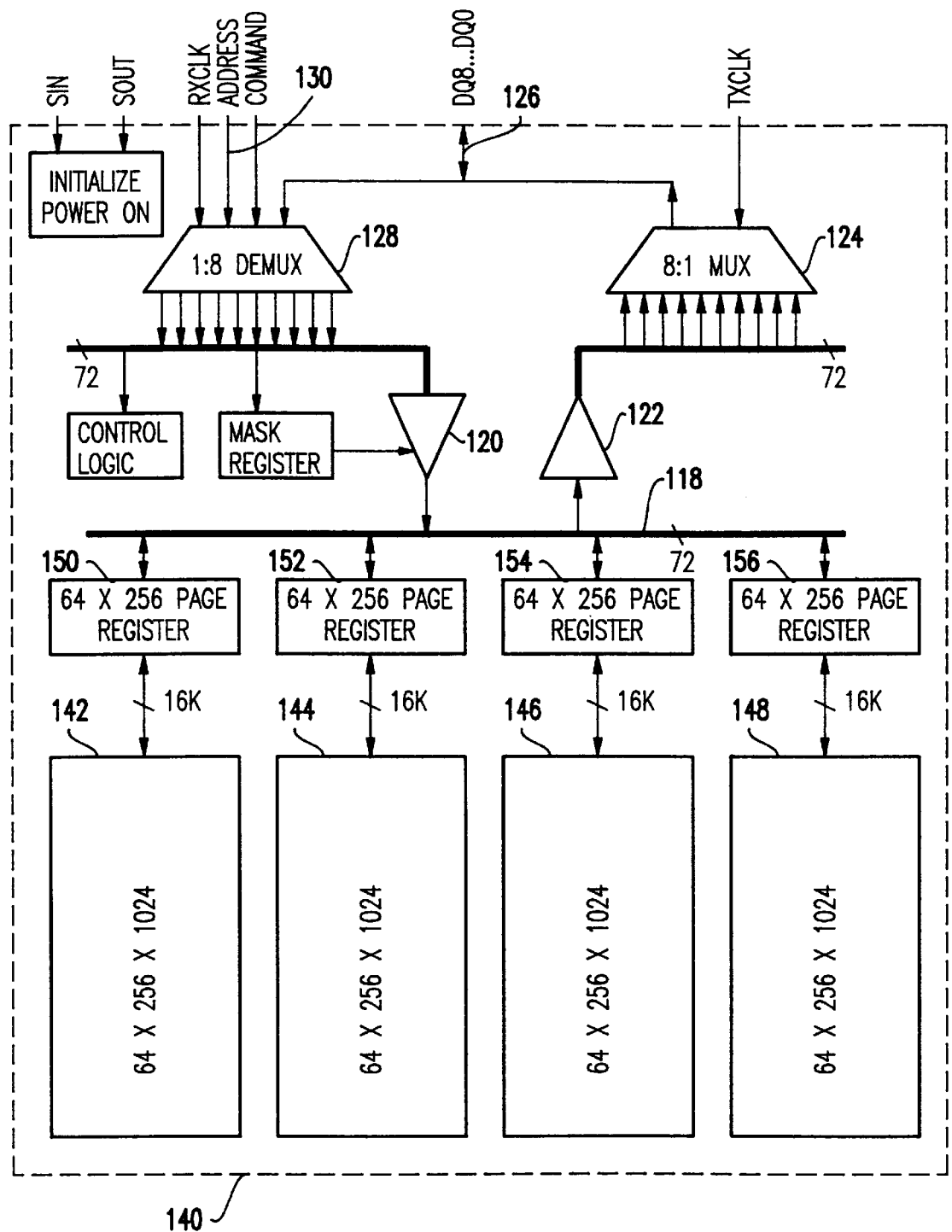
FIG. 2 is a schematic of a first preferred embodiment DRAM chip.

FIG. 2 is a schematic of a first preferred embodiment high performance DRAM according to the present invention, wherein the chip is designed for normal operation as a ×8 configuration (in Normal Mode), but may be configured ×9 (in ECC mode). In Normal mode: 8 bits of its 72 bit data path are disabled or ignored; none of the memory locations are left unused on a preferred embodiment chip; all memory address locations are available on eight enabled data I/Os 126. In ECC mode: the entire 72 bit data path is used; one eighth of the array is remapped to provide error check bits for data residing in the rest of the array; one eighth of the memory address locations are unaddressable; the remaining seven-eighths memory address locations are available on nine enabled data I/Os 126.

In the example of FIG. 2, the DRAM includes a 64 Mb array of four 16 Mb sub-arrays 142, 144, 146 and 148. It is understood that although the present invention is described in terms of a 64 Mb chip, the organization and density are for example only and, not intended as a limitation. For example, the chip may be 256 Mb, one Gigabit (1 Gb) or larger with its array in correspondingly larger sub-arrays or in more sub-arrays. Further, the 8/9 data I/O for chip 140 is by way of example only. The base data I/O may be any multiple of two, for example, by sixteen (reconfigurable as ×17, ×18, ×19 or any other desired data I/O configuration).

In this first preferred embodiment, setting chip organization/configuration as Normal mode or ECC mode primarily affects the page register 150, 152, 154 and 156 operation. If the chip 140 is configured ×8, then the page registers 150, 152, 154 and 158 are organized 64×256. However, if the chip is organized ×9, then the page registers 150, 152, 154 and 156 are organized 72×224. As in the 72 Mb chip 100 of FIG. 1, data to/from page registers 150, 152, 154 and 156 is transferred on Seventy-Two Bit Bus 118 from drivers 120 or to buffers 122. The remaining elements of the chip 140 in FIG. 2 are identical or, substantially identical to corresponding elements of the chip 100 in FIG. 1 with substantially identical operation. Corresponding elements are labeled identically.

Figure 3:
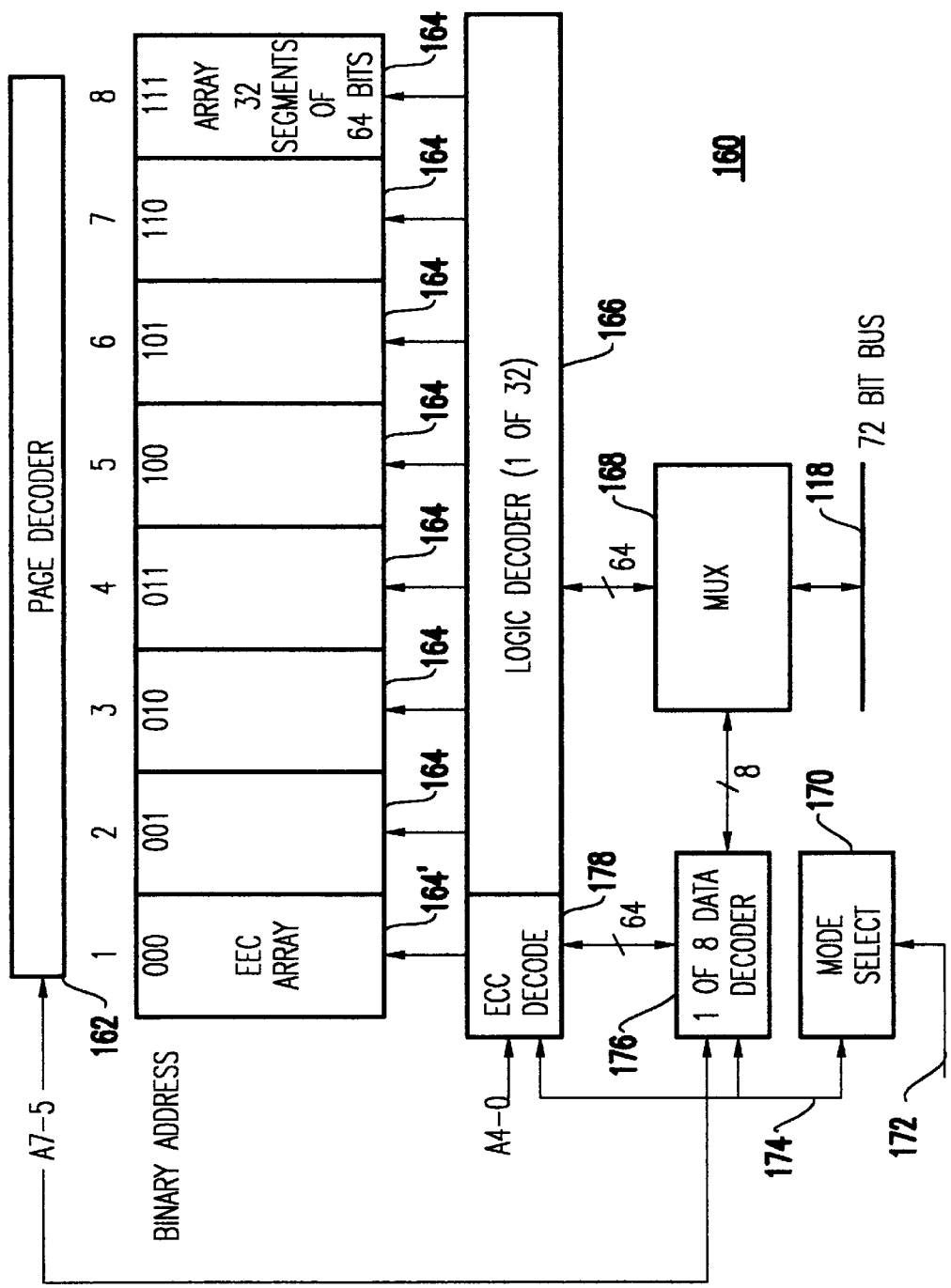
FIG. 3 is a block diagram of a page register in the preferred embodiment of FIG. 2.

FIG. 3 is a block diagram of a page register 160, typical of page registers 150, 152, 154 and 156 in the first preferred embodiment of FIG. 2. Page register 160 includes a page decoder 162 for selecting one of eight sub-page arrays 164. Each sub-page array 164 is organized as thirty-two 64-bit segments.

Chip mode selection is set in Mode Select block 170 by fuse programming, by setting a bit in a mode register or, by any equivalent method. Alternatively, the mode may be fixed by metal mask programming or wire bond selection. The selection input to Mode Select Block 170 is connected at input 172.

In normal mode, page decoder 162 selects one-of-eight sub-page arrays 164. Logic decoder 166 is a one-of-thirty-two decoder to select one segment of 64 bits from the decoded sub-page arrays. Mux 168 is, essentially, two banks of gatable transceivers, a sixty four bit bank and an eight bit bank. In Normal mode the eight bit bank is disabled, i.e., gated off. So, the selected 64 bit segment is coupled to Seventy-Two Bit Bus 118 by mux 168. As described above, in normal mode eight bits of the data path between Seventy-Two Bit Bus 118 and data I/Os 126 are ignored.

When the Mode Select block 170 is set for ECC mode, the output 174 of Mode Select block 170 enables ECC Decode 176, 1:8 Decoder 178 and the eight bit bank of mux 168. Note that in this example, sub-page array 164' is pre-designated as the check bit array, although any sub-page may be chosen for the ECC array. The page decoder 162 is programmed to select seven out of eight possible sub-pages. The eighth sub-page or ECC array is accessed every page decode and precedes the ECC bits for all other sub-pages. ×9 Decoder 176 selects one sixty-four bit segment in check bit array 164'. The selected segment is passed to 1:8 Decoder 178, which selects one byte that it passes to the eight bit bank of mux 168. Mux 168 merges the selected byte (the check bits) with a selected data segment and, seventy-two bits (sixty-four data bits and eight check bits) are provided to Seventy-Two Bit Bus 118. Finally, as described above, data is transferred between Seventy-Two Bit Bus 118 and all nine bits of data I/Os 126 in ECC mode.

Figure 4:
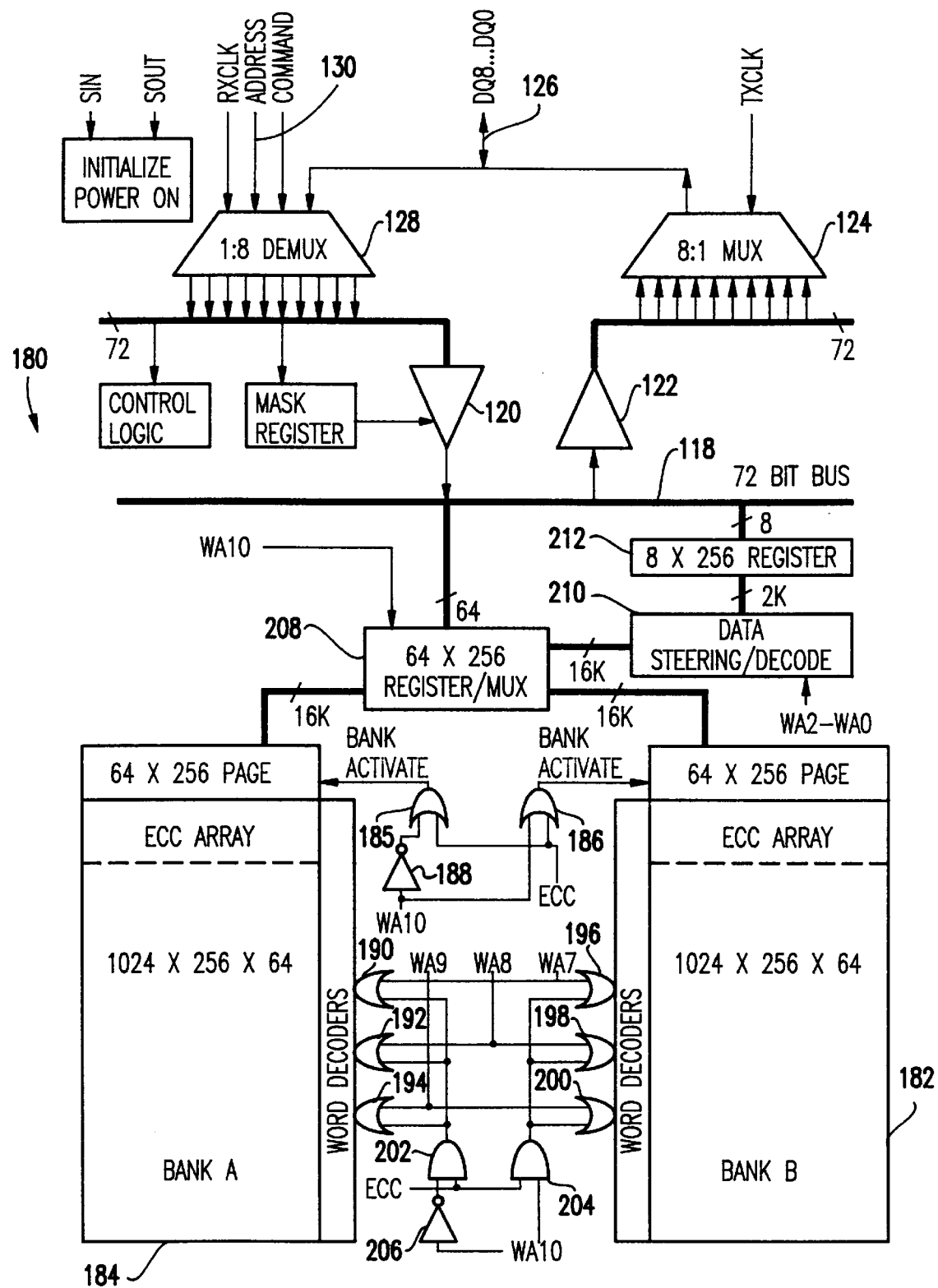
FIG. 4 is a schematic of a second preferred embodiment DRAM.

FIG. 4 is a schematic of a second preferred embodiment chip 180. In normal mode, the ECC line is low and either of the banks 182, 184 may be independently selected. Address WA10 selects either bank 182 or 184 through select logic, NOR gates 186, 185 and invertor 188. All bank locations are addressable data locations and are coupled to 64×256 Register/Mux 208, which couples the sixty-four bits to Seventy-Two Bit Bus 118. The remaining eight bits of the internal Seventy-Two Bit Bus 118 are held inactive and ignored. That sixty-four bits on Seventy-Two Bit Bus 118 are coupled off-chip on outputs DQ0–7. DQ8 is held in its high impedance state.

In this second embodiment, for ECC mode the ECC line is high and banks 182, 184 are selected. In each bank, one part of the sub-array provides data storage and the remaining part provides check bit storage for the other bank. In each access, data is transferred to/from one bank 182 or 184, check bits are transferred to/from the other 184 or 182. So, one eighth of each bank 182 or 184 is set aside for check bit storage, i.e., dedicated for storing check bits for data stored in the other bank 184 or 182. It should be noted that the address space for this dedicated one-eighth, or octant, of each sub-array is inaccessible for non-ECC data storage.

The high on the ECC line enables accessing both banks 182, 184, simultaneously in this second preferred embodiment. Word Address WA10, through select logic (NOR gates 190, 192, 194, 196, 198, 200, invertor 206 and NAND gates 202 and 204) selects one bank 182, 184 as data storage (hereinafter the data sub-array) and the other bank 184, 182 as check bit storage (hereinafter the ECC bank). Word Addresses WA9-7 select one of seven data octants in the data sub-array, the eighth octant being identified for ECC storage for the other bank and, so, being inaccessible for non-ECC data. During an access, each bank 182, 184 couples sixteen Kilobits (16 Kb) to 64×256 Register/Mux 208. As in normal mode, 84×256 Register/Mux 208 couples data from the data sub-array (as determined by WA10) to Seventy-Two Bit Bus 118.

However, for the second preferred embodiment DRAM, the 16 Kb block from the ECC bank are coupled to a Data Steering/Decode circuit 210. The Data Steering/Decode circuit 210 couples one eighth of the 16 Kb block of parity/check bits to a register 212 in response to Addresses WA2-0. The 8×256 Register 212 couples the check bit byte to the Seventy-Two Bit Bus 118. The sixty-four bits from the 64×256 Register/Mux 192, augmented by the eight bits from the 8×256 Register are coupled off-chip on I/Os 126, DQ0–8.

In either embodiment ECC mode operation uses more power than the normal mode operation simply because both banks are activated. Optionally, the word lines of the designated parity/check bit octants may be segmented into smaller (one eighth) word lines to reduce power.

Thus, the preferred embodiments provide high bandwidth DRAMs for use in memory system regardless of whether ECC is required.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A Random Access Memory (RAM) comprising:

an array of memory cells arranged in addressable rows and columns, said memory cells being grouped into groups, accessing means for accessing each of said groups;

selection means for selecting an organization state of said array of memory cells as being either a Normal mode or an ECC mode, each of said groups including a first number of said memory cells in said Normal mode increased to a second number of said memory cells in ECC mode, wherein in said Normal mode none of said memory cells in said array stores ECC data, so that all of said memory cells in said array are mapped for storing non-ECC data; and means for selectively dividing said array into a first portion and a second portion whenever said organization state is selected as said ECC mode, said memory cells in said first portion being mapped for storing ECC data and said memory cells in said second portion being mapped for storing non-ECC data, each said group including at least one of said memory cells in said first portion mapped for storing ECC data and one or more of said memory cells in said second portion mapped for storing non-ECC data.

2. The RAM of claim 1 wherein fewer groups are available in ECC mode than in Normal mode.

3. The RAM of claim 2 wherein the array includes at least two sub-arrays and the accessing means comprises a page register at each said sub-array, each said page register including enough register locations to store one page of sub-array memory cells.

4. The RAM of claim 3, wherein said at least two sub-arrays correspond to at least one pair of sub-arrays, and wherein the means for selectively dividing the array divides each of said at least one pair of sub-arrays into first and second portions, memory cells mapped for storing ECC data in the first portion of each of said sub-array pair being paired with cell groups in the second portion of the other of said sub-array pair.

5. The RAM of claim 4 wherein the cell groups are 8 bit groups, said RAM being accessed by 8 in Normal mode and by 9 in ECC mode.

6. The RAM of claim 5 having one-eighth fewer groups in ECC mode than in Normal mode.

7. The RAM of claim 1, wherein said selective dividing means includes a plurality of page registers which divide said array into said first portion and said second portion in accordance with the organization state selected by said selection means.

8. A Dynamic RAM (DRAM) comprising:

an array of memory cells arranged into two or more sub-arrays of said memory cells, said memory cells in said sub-arrays arranged in addressable rows and columns;

accessing means for accessing groups of said memory cells;

selection means for selecting an organization state of said array as being either a Normal mode or an ECC mode, fewer groups of said memory cells being available in said ECC mode than in said Normal mode, wherein in said Normal mode none of said memory cells in said array stores ECC data, so that all of said memory cells in said array are mapped for storing non-ECC data; and means for selectively dividing said sub-arrays into first and second portions whenever said organization state is said ECC mode, said memory cells in said first portion mapped for storing ECC data, said memory cells for storing ECC data in each said sub-array being paired with memory cells in a second portion of another sub-array, said memory cells in said second portion being mapped for storing non-ECC data, wherein each said group of memory cells includes at least one of said memory cells for storing ECC data, all of said memory cells being grouped into said groups.

9. The DRAM of claim 8 wherein two or more sub-arrays is at least one pair of sub-arrays.

10. The DRAM of claim 9 wherein the cell groups are 8 bit groups, said DRAM being accessed by 8 in Normal mode and by 9 in ECC mode.

11. The DRAM of claim 8 having one-eighth fewer groups in ECC mode than in Normal mode.

12. A Dynamic RAM (DRAM) comprising:

an array of memory cells arranged into two or more sub-arrays of said memory cells, said memory cells in said sub-arrays arranged in addressable rows and columns;

accessing means for accessing groups of said memory cells;

selection means for selecting an organization state of said array as being either a Normal mode or an ECC mode, fewer groups of said memory cells being available in said ECC mode than in said Normal mode, wherein in said Normal mode none of said memory cells in said array stores ECC data, so that all of said memory cells in said array are available for storing non-ECC data; and means for selectively dividing said sub-arrays into first and second portions whenever said organization state is said ECC mode, memory cells in said first portion of each said sub-array mapped for storing ECC data, each of said memory cells for storing ECC dTA in each said sub-array being paired with memory cells in a second portion of said sub-array, said memory cells in said second portion being mapped for storing non-ECC data, wherein each said group of memory cells includes at least one of said memory cells for storing ECC data, all of said memory cells being grouped into said groups.

13. The DRAM of claim 12 wherein two or more sub-arrays is four sub-arrays.

14. The DRAM of claim 13 wherein the cell groups are 8 bit groups, said DRAM being accessed by 8 in Normal mode and by 9 in ECC mode.

15. The DRAM of claim 12 having one-eighth fewer groups in ECC mode than in Normal mode.

16. A Random Access Memory (RAM) comprising:

an array of memory cells arranged in addressable rows and columns, said memory cells being grouped into groups, accessing means for accessing each of said groups;

selection means for selecting an organization state of said array as being either a ×8 mode or a ×9 mode, each of said groups including a first number of said memory cells in said ×8 mode and increased to a second number of said memory cells in said ×9 mode, wherein in said ×8 mode none of said memory cells in said array stores ECC data, so that all of said memory cells in said array are mapped for storing non-ECC data; and means for selectively dividing said array into a first portion and a second portion whenever said organization state is selected as said ×9 mode, said memory cells in said first portion mapped for storing ECC data, each said group including at least one of said memory cells for storing ECC data and one or more memory cells in said second portion mapped for storing non-ECC data.

\* \* \* \* \*